(12) United States Patent
Olsen et al.

(10) Patent No.: US 7,422,631 B2  
(45) Date of Patent: Sep. 9, 2008

(54) MOULD PARTS OF SILICON NITRIDE AND METHOD FOR PRODUCING SUCH MOULD PARTS

(75) Inventors: Espen Olsen, Trondheim (NO); Arve Solheim, Tiller (NO); Havard Sorheim, Trondheim (NO)

(73) Assignee: Crusin AS (NO)

( * ) Notice: Subject to any disclaimer, the term of this patent is extended or adjusted under 35 U.S.C. 154(b) by 618 days.

(21) Appl. No.: 10/520,834

(22) PCT Filed: Aug. 13, 2003

(86) PCT No.: PCT/NO03/00274

§ 371 (c)(1), (2), (4) Date: Feb. 3, 2005

(87) PCT Pub. No.: WO2004/016835

PCT Pub. Date: Feb. 26, 2004

(65) Prior Publication Data

US 2005/0118461 A1 Jun. 2, 2005

(30) Foreign Application Priority Data

Aug. 15, 2002 (NO) .................. 20023865

(51) Int. Cl.
*C01B 21/06* (2006.01)
*C01B 21/068* (2006.01)
*C30B 15/00* (2006.01)
*C30B 27/02* (2006.01)
*C30B 28/10* (2006.01)
*B22F 1/00* (2006.01)
*B22F 3/093* (2006.01)
*B22F 3/10* (2006.01)

(52) U.S. Cl. ............. 117/13; 423/406; 423/344; 117/213; 117/900; 419/39; 419/56

(58) Field of Classification Search ........... 423/344, 423/406; 428/698; 117/900, 213; 419/39, 419/56

See application file for complete search history.

(56) References Cited

U.S. PATENT DOCUMENTS 4,515,755 A 5/1985 Matsuo et al.

(Continued)

FOREIGN PATENT DOCUMENTS

EP 1160223 A1 12/2001

(Continued)

OTHER PUBLICATIONS

English Translation of Office Action dated Nov. 6, 2004 in Norwegian Patent Application No. 20023865.
English Translation of Office Action dated Apr. 28, 2003 in Norwegian Patent Application No. 20023865.

*Primary Examiner*—Ngoc-Yen M. Nguyen
*Assistant Examiner*—Diana J Liao
(74) *Attorney, Agent, or Firm*—Lucas & Mercanti, LLP

(57) ABSTRACT

The present invention relates to silicon nitride mould parts, particularly crucibles for use in connection with directional solidification and pulling of silicon single crystals. The mould parts consist of $Si_3N_4$ having a total open porosity between 40 and 60% by volume and where more than 50% of the pores in the surface of the mould parts have a size which is larger than the means size of the $Si_3N_4$ particles. The invention further relates to a method for producing the silicon nitride mould parts.

12 Claims, 1 Drawing Sheet

Figure 1:
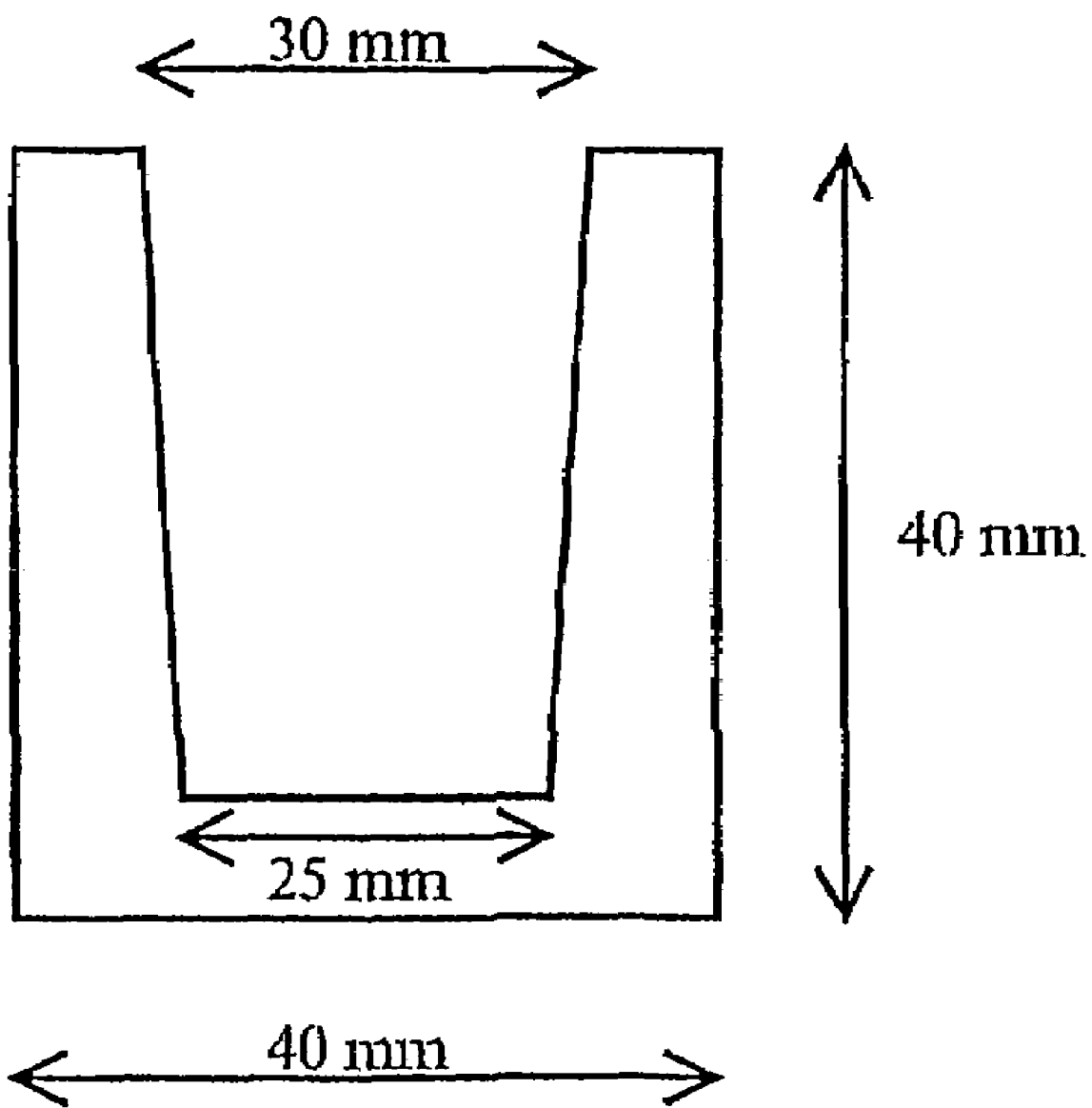

U.S. PATENT DOCUMENTS 5,618,765 A * 4/1997 Takeuchi et al. ............ 501/80
2003/0176271 A1 * 9/2003 Kriegesmann ............ 501/97.1
2004/0211496 A1 10/2004 Khattak et al.

FOREIGN PATENT DOCUMENTS

JP 59-162199 9/1984

* cited by examiner

MOULD PARTS OF SILICON NITRIDE AND METHOD FOR PRODUCING SUCH MOULD PARTS

FIELD OF INVENTION

The present invention relates to mould parts of silicon nitride for use in connection with molten metal, particularly molten silicon, and to a method for producing such mould parts.

BACKGROUND ART

It is known to use quartz crucibles during crystallising of pure molten silicon by directional solidification and by crystal pulling from pure molten silicon, Quartz crucibles have, however, the drawback that quartz is wet by molten silicon, and solidified silicon will thereby affix to the walls in the quartz crucibles. Further, quartz and silicon have different coefficients of thermal expansion, resulting in that when molten silicon solidifies in a quartz crucible, thermal stress will be introduced in the quartz crucible which will destroy the crucible. Quartz crucibles can therefore only be used once.

From JP-59-62199 it is known a method for the production of silicon nitride crucibles for use in pulling silicon crystals. The crucible according to JP-59-62199 can be produced by forming silicon powder by cold pressing, whereafter the crucible is heated in an inert atmosphere in a first step and thereafter nitridation is carried out at a higher temperature in a second step. According to JP-59-62199 the produced crucibles have a density of 85% of the theoretical density for silicon nitride.

The crucibles according to JP-59-62199 have a good strength, but are wet by molten silicon to such an extent that the solidified silicon ingot sticks to the walls in the crucible. The ingot can thus not be removed from the crucible without destroying the crucible. The crucibles according to JP-59-62199 can thus only be used once when they are used for directional solidification of silicon. The same is true also when the crucibles according to JP-59-62199 are used for crystal pulling of silicon single crystals.

DESCRIPTION OF INVENTION

The object of the present invention is to provide silicon nitride mould parts, such as crucibles, which are not wet by molten silicon thus avoiding that molten silicon which is solidified in the crucibles sticks to the wall of the crucible.

The present invention thus relates to silicon nitride mould parts, particularly crucibles for use in connections with directional solidification and pulling of silicon single crystals, which mould parts consist of $Si_3N_4$ having a total open porosity between 40 and 60% by volume and where more than 50% of the pores in the surface of the mould parts have a size which is larger than the mean size of the $Si_3N_4$ particles.

According to a preferred embodiment the mould parts are coated with silicon nitride particles having an average particle size of less than 50 μm.

It has surprisingly by been found that $Si_3N_4$ mould parts having such an open porosity are not wet by molten silicon and have a strength making it possible to reuse the crucibles a number of times for directional solidification of molten silicon.

According to another aspect, the present invention relates to a method for the production of silicon nitride mould parts, particularly crucibles for use in connection with directional solidification of silicon, where particulate silicon having a particulate size of less then 100 μm is formed to a mould part and subjected to nitridation for conversion of the silicon particles to $Si_3N_4$, which method is characterized in that the forming is carried out under such a pressure and with such a particle size distribution of the silicon particles that the finished silicon nitride mould part has an open porosity between 40 and 60% by volume. Further, more than 50% of the surface of the finished mould parts that consist of pores that breaks through the surface, have pores which are greater than the mean size of the $Si_3N_4$ particles.

The shaping of mould parts from the silicon particles is preferably carried out at a pressure of below 200 MPa, and it is particularly preferred to carry out the shaping of the mould parts using vibration.

Tests with the use of $Si_3N_4$ crucibles according to the present invention for directional solidification of molten silicon have shown that the solidified ingot did not, or to a very limited extent, stick to the walls of the crucibles. It was very surprising that crucibles having a high open porosity of between 40 and 60% by volume showed this property.

By providing the crucibles with a layer of silicon nitride powder with an average particle size of maximum 50 μm, any attachment of solidified silicon to the walls of the crucibles is avoided.

SHORT DESCRIPTION OF THE FIGURES

FIG. 1 shows the shape and dimensions of the crucible produced according to example 1.

DETAILED DESCRIPTION OF THE INVENTION

EXAMPLE 1

A $Si_3N_4$ crucible was produced according to the method of the present invention. Silicon powder having a particle size below 75 μm sold by Elkem ASA under the trademark SILGRAIN was filled into a mould having the shape and dimensions as shown in FIG. 1. The silicon powder was compacted by vibration whereafter the crucible was nitrided at a temperature between 1105 and 1380° C. in a vertical tube furnace until a conversion of silicon to $Si_3N_4$ of 97% of theoretic conversion was achieved.

The produced crucible had an open porosity of 41.25% by volume and a density of 1.85 g/cm$^3$.

The crucible according to the invention was used for directional solidification of silicon. The directional solidification was done by filling particulate silicon in the crucible. The crucible was then placed in a vertical tube furnace and argon was supplied to the furnace in order to prevent oxidation of the crucible and of the molten silicon. The silicon in the crucible was melted at a temperature of 1500° C. The crucible was thereafter slowly lowered down through the furnace until the bottom of the crucible was positioned outside the hot zone. In this position the temperature was lowered 60° C. pr. hour until the temperature reached 1375° C. The crucible was then cooled to room temperature. Upon examination it was found that the solidified silicon ingot was only affixed to the crucible on a few spots at the walls of the crucible where the open porosity was below 40% by volume and where the size of the pores was smaller than the $Si_3N_4$ particles.

EXAMPLE 2

A crucible produced as described in example 1 was coated on its inside walls with $Si_3N_4$ powder. The crucible was used for directional solidification of silicon according to the procedure described in example 1. Examination showed that the solidified silicon ingot was not affixed to the crucible.

The invention claimed is:

1. A silicon nitride mould crucible for use in connection with directional solidification and pulling of silicon single crystals, where the crucible consists of $Si_3N_4$ particles made by nitriding compacted particulate silicon, wherein the crucible has pores, a total open porosity between 40 and 60% by volume, and more than 50% of the pores in a surface of the crucible has a size which is larger than the means size of the $Si_3N_4$ particles.

2. The crucible according to claim 1, wherein the crucible is coated with silicon nitride particles having an average particle size of less then 50 μm.

3. The crucible of claim 1, wherein the crucible is made from silicon particles having a particle size less than 100 μm.

4. The crucible of claim 3, wherein the crucible is made by compacting silicon particles at a pressure below 200 MPa prior to nitriding.

5. The crucible of claim 4, wherein the compacting is conducted by vibration.

6. A method for the production of a silicon nitride mould crucible for use in connection with directional solidification and pulling of silicon single crystals, comprising the steps of:
   forming particulate silicon having a particle size of less than 100 μm into a mould crucible and
   subjecting said formed crucible to nitridation for conversion of the silicon particles to $Si_3N_4$,
   wherein the forming step is carried out under such a pressure and with such a particle size distribution of the silicon particles that the finished silicon nitride mould crucible has an open porosity between 40 and 60% by volume and where more than 50% of the pores in the surface of the finished mould part are greater than the mean size of the $Si_3N_4$ particles.

7. The method according to claim 6, wherein the forming of the mould crucible from the silicon particles is carried out at a pressure of below 200 Mpa.

8. The method according to claim 6, wherein the forming of the mould crucible is carried out using vibration.

9. A method of directional solidification and pulling of silicon single crystals, comprising:
   filling a crucible with particulate silicon, wherein, the crucible consists of $Si_3N_4$ particles made by nitriding compacted particulate silicon, the crucible has pores, a total open porosity between 40 and 60% by volume, and more than 50% of the pores in a surface of the crucible has a size which is larger than the mean size of the $Si_3N_4$ particles;
   melting the silicon in the crucible in a furnace to form molten silicon in the crucible; and
   cooling the molten silicon in the crucible.

10. The method of claim 9, further comprising:
    coating an inside wall surface of the crucible with silicon nitride particles having an average particle size of less then 50 μm.

11. The method of claim 9, wherein the melting is conducted in a furnace at a temperature of 1500° C. and argon gas is supplied to the furnace.

12. The method of claim 9, wherein the cooling is conducted initially by lowering the temperature at 60° C. per hour until a temperature of 1375° C. is reached and then cooling to room temperature.

* * * * *